(12) United States Patent
Iijima et al.

(10) Patent No.: US 11,355,512 B2
(45) Date of Patent: Jun. 7, 2022

(54) SEMICONDUCTOR DEVICE INCLUDING A PLUG CONNECTED TO A BIT LINE AND CONTAINING TUNGSTEN

(71) Applicant: Kioxia Corporation, Tokyo (JP)

(72) Inventors: Jun Iijima, Yokkaichi Mie (JP); Masayoshi Tagami, Kuwana Mie (JP); Masayuki Kitamura, Yokkaichi Mie (JP); Satoshi Wakatsuki, Yokkaichi Mie (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 16/800,163

(22) Filed: Feb. 25, 2020

(65) Prior Publication Data
US 2021/0082944 A1 Mar. 18, 2021

(30) Foreign Application Priority Data
Sep. 13, 2019 (JP) .............................. JP2019-167476

(51) Int. Cl.
*H01L 23/532* (2006.01)
*H01L 21/768* (2006.01)
*H01L 27/11575* (2017.01)

(52) U.S. Cl.
CPC .. *H01L 27/11575* (2013.01); *H01L 21/76804* (2013.01); *H01L 21/76877* (2013.01); *H01L 21/76895* (2013.01); *H01L 23/53228* (2013.01); *H01L 23/53257* (2013.01); *H01L 23/53295* (2013.01)

(58) Field of Classification Search
CPC ......... H01L 21/76844; H01L 21/76831; H01L 23/5329; H01L 23/53295; H01L 23/522; H01L 23/5226; H01L 23/5386; H01L 23/528; H01L 23/5283
See application file for complete search history.

(56) References Cited

U.S. PATENT DOCUMENTS

| 8,044,519 B2 | 10/2011 | Watanabe et al. |
| 9,343,357 B2 | 5/2016 | Xu et al. |
| 2001/0006255 A1* | 7/2001 | Kwon ................. H01L 23/5226 257/751 |

(Continued)

FOREIGN PATENT DOCUMENTS

| JP | H11-340330 A | 12/1999 |
| JP | 2009-147137 A | 7/2009 |

(Continued)

*Primary Examiner* — Thanhha S Pham
(74) *Attorney, Agent, or Firm* — Kim & Stewart LLP

(57) ABSTRACT

A semiconductor device includes a substrate, a logic circuit provided on the substrate, a wiring layer including a plurality of wirings that are provided above the logic circuit, a first insulating film below the wiring layer, a plug, and a second insulating film. Each of the wirings contains copper and extends along a surface plane of the substrate in a first direction. The wirings are arranged along the surface plane of the substrate in a second direction different from the first direction. The plug extends through the first insulating film in a third direction crossing the first and second directions and is electrically connected to one of the wirings. The plug contains tungsten. The second insulating film is provided between the first insulating film and the plug.

13 Claims, 19 Drawing Sheets

(56) References Cited

U.S. PATENT DOCUMENTS

| | | |
|---|---|---|
| 2006/0131754 A1 | 6/2006 | Ohtake et al. |
| 2015/0140731 A1* | 5/2015 | Isobe .................... H01L 29/495 |
| | | 438/104 |
| 2017/0053868 A1* | 2/2017 | Lin .................... H01L 23/53266 |
| 2019/0081069 A1* | 3/2019 | Lu ...................... H01L 27/11573 |
| 2019/0088676 A1 | 3/2019 | Tagami et al. |
| 2019/0363129 A1 | 11/2019 | Yokoyama et al. |

FOREIGN PATENT DOCUMENTS

| | | |
|---|---|---|
| JP | 2017-508290 A | 3/2017 |
| TW | 201841344 A | 11/2018 |
| TW | 201924030 A | 6/2019 |

\* cited by examiner

US 11,355,512 B2

SEMICONDUCTOR DEVICE INCLUDING A PLUG CONNECTED TO A BIT LINE AND CONTAINING TUNGSTEN

CROSS-REFERENCE TO RELATED APPLICATION(S)

This application is based upon and claims the benefit of priority from Japanese Patent Application No. 2019-167476, filed on Sep. 13, 2019, the entire contents of which are incorporated herein by reference.

FIELD

Embodiments described herein relate generally to a semiconductor device and a manufacturing method of the semiconductor device.

BACKGROUND

When a via plug is formed on a wiring, a material of the wiring and a material of the via plug may react with each other. In this case, it is desirable to prevent the reaction between the material of the wiring and the material of the via plug.

DESCRIPTION OF THE DRAWINGS

FIGS. 19A and 18B illustrate cross-sectional views of a second example of the structures of the semiconductor device according to the third embodiment.

DETAILED DESCRIPTION

Figure 1A:
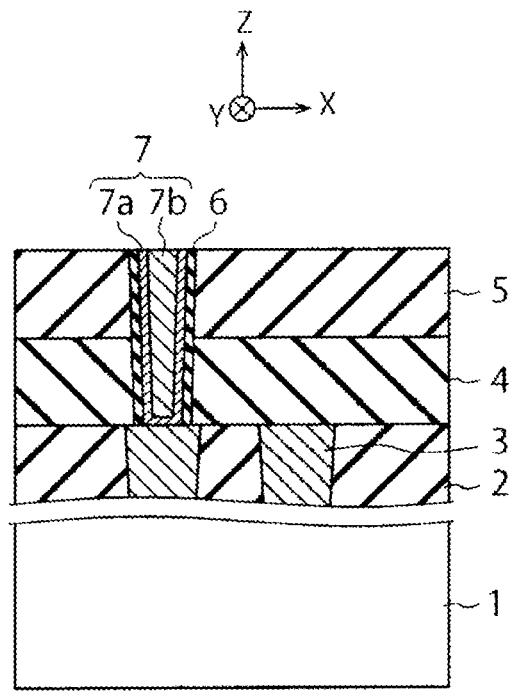
FIGS. 1A and 1B illustrate cross-sectional views of a semiconductor device according to a first embodiment.

Embodiments provide a semiconductor device that is less likely to cause reaction between a wiring and a plug and a manufacturing method thereof.

In general, according to an embodiment, a semiconductor device includes a substrate, a logic circuit provided on the substrate, a wiring layer including a plurality of wirings that are provided above the logic circuit, a first insulating film below the wiring layer, a plug, and a second insulating film. Each of the wirings contains copper and extends along a surface plane of the substrate in a first direction. The wirings are arranged along the surface plane of the substrate in a second direction different from the first direction. The plug extends through the first insulating film in a third direction crossing the first and second directions and is electrically connected to one of the wirings. The plug contains tungsten. The second insulating film is provided between the first insulating film and the plug.

Hereinafter, example embodiments of the present disclosure will be described with reference to the drawings. In the figures, the components/aspects that are the same or substantially the same are denoted with the same reference numerals, and a description of such components/aspects may be omitted in some instances.

First Embodiment

Figure 1B:
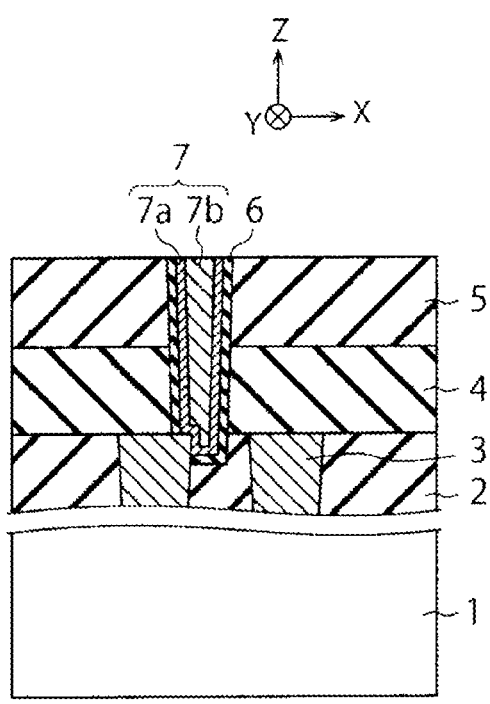

FIGS. 1A and 1B illustrate cross-sectional views of a semiconductor device according to a first embodiment.

As shown in FIG. 1A or 1B, the semiconductor device according to the present embodiment includes a substrate 1, a first interlayer insulating film 2, a plurality of wirings 3, a second interlayer insulating film 4, a third interlayer insulating film 5, an insulating film 6, and a via plug 7. The second interlayer insulating film 4 and the third interlayer insulating film 5 are examples of a first insulating film, the insulating film 6 is an example of a second insulating film, and the via plug 7 is an example of a plug. The via plug 7 includes a first metal layer 7a, which is an example of a first layer, and a second metal layer 7b, which is an example of a second layer.

FIG. 1A shows the semiconductor device in a case where the via plug 7 has been formed without a positional deviation with respect to the wiring 3, and FIG. 1B shows the semiconductor device in a case where the via plug 7 has been formed with a positional deviation with respect to the wiring 3. In this context, such a positional deviation may be unintentional, such as deviations related to manufacturing tolerances or the like. Hereinafter, the structure of the semiconductor device according to the embodiment will be described with reference to FIG. 1A and FIG. 1B is also referred to when appropriate.

The substrate 1 is, for example, a semiconductor substrate such as a silicon (Si) substrate. FIG. 1A shows an X direction and a Y direction, which are perpendicular to each other and in parallel to a surface plane of the substrate 1, and a Z direction that is perpendicular to the surface plane of the substrate 1 and is along a depth direction of the substrate 1. In this specification, a +Z direction is taken as an upward direction and a −Z direction is taken as a downward direction. The −Z direction may coincide with the gravity direction or may not coincide with the gravity direction. The Y direction is an example of a first direction, and the X direction is an example of a second direction intersecting the first direction, and the Z direction is an example of a third direction intersecting the first and the second directions.

The first interlayer insulating film 2 is formed on the substrate 1. The first interlayer insulating film 2 is, for example, a silicon oxide film (a $SiO_2$ film). The first interlayer insulating film 2 may be formed directly on the substrate 1, or may be formed on the substrate 1 via another layer.

The plurality of wirings 3 are provided in the same wiring layer above the substrate 1, and are formed inside the first interlayer insulating film 2. FIG. 1A shows two wirings 3 as an example. The wirings 3 extend in the Y direction and are spaced apart from each other in the X direction. The wirings 3 in the present embodiment are metal wirings containing copper (Cu), and are, for example, Cu wirings.

The second interlayer insulating film 4 and the third interlayer insulating film 5 are formed successively on the first interlayer insulating film 2 and the wirings 3. The second interlayer insulating film 4 is, for example, a silicon carbonitride film (a SiCN film). The third interlayer insulating film 5 is, for example, a silicon oxide film.

The insulating film 6 and the via plug 7 are formed on one of the wirings 3 and are inside the second interlayer insulating film 4 and third interlayer insulating film 5. FIG. 1A shows the insulating film 6 and the via plug 7 formed on the left wiring 3. The left wiring 3 in FIG. 1A is an example of a first wiring. The via plug 7 in the present embodiment extends in the Z direction on the left wiring 3. The insulating film 6 in the present embodiment is a metal film containing aluminum (Al) and oxygen (O), and is, for example, an aluminum oxide film (a $Al_2O_3$ film). On the other hand, the via plug 7 includes, for example, the first metal layer 7a and the second metal layer 7b. The first metal layer 7a in the present embodiment is a metal layer containing tungsten (W), and is, for example, a tungsten liner layer. In addition, the second metal layer 7b in the present embodiment is a metal layer containing tungsten (W), and is, for example, a tungsten plug material layer. In this manner, the via plug 7 in the present embodiment is, for example, a tungsten layer. In such a case, the first metal layer 7a (the tungsten liner layer) and the second metal layer 7b (the tungsten plug material layer) may not be readily or at all distinguishable from each other.

As will be described below, the insulating film 6 and the via plug 7 in the present embodiment are formed by forming a via hole reaching any of the wirings 3 in the second interlayer insulating film 4 and the third interlayer insulating film 5 and forming the insulating film 6, the first metal layer 7a, and the second metal layer 7b sequentially in the via hole. As a result, the via plug 7 is formed inside the second interlayer insulating film 4 and the third interlayer insulating film 5 with the insulating film 6 placed in between, and the second metal layer 7b is formed in the second interlayer insulating film 4 and the third interlayer insulating film 5 with the insulating film 6 and the first metal layer 7a placed in between.

However, the insulating film 6 according to the present embodiment is selectively formed on surfaces of the second interlayer insulating film 4 and the third interlayer insulating film 5 between the surfaces of the second interlayer insulating film 4 and the third interlayer insulating film 5 and a surface of the wiring 3. The insulating film 6 of FIG. 1A is formed on side surfaces of the second interlayer insulating film 4 and the third interlayer insulating film 5, and is not formed on an upper surface of the wiring 3. More precisely, the insulating film 6 of FIG. 1A is only abutted against a part of the upper surface of the left wiring 3 and is not formed on the entire upper surface of the left wiring 3.

As a result, the via plug 7 according to the present embodiment is abutted against the upper surface of the wiring 3, and is electrically connected to the wiring 3. The via plug 7 of FIG. 1A is formed on the side surfaces of the second interlayer insulating film 4 and the third interlayer insulating film 5 with the insulating film 6 placed in between, and is formed on the upper surface of the wiring 3 without interposition of the insulating film 6.

Specifically, the first metal layer 7a of FIG. 1A is formed on the side surfaces of the second interlayer insulating film 4 and the third interlayer insulating film 5 with the insulating film 6 placed in between, and is formed on the upper surface of the left wiring 3 without interposition of the insulating film 6. Further, the second metal layer 7b in FIG. 1A is formed on the side surfaces of the second interlayer insulating film 4 and the third interlayer insulating film 5 with the insulating film 6 and the first metal layer 7a placed in between, and is formed on the upper surface of the left wiring 3 with the first metal layer 7a placed in between.

The via plug 7 according to the present embodiment is formed on the wiring 3 having the same width as the plug diameter of the via plug 7, and may also be formed on the wiring 3 having a width larger than the plug diameter of the via plug 7. For example, the via plug 7 may be formed on a metal pad (a Cu pad) constituting a portion of the wiring 3. In other cases, the wiring 3 may be a metal plug (e.g., a Cu plug) such as a contact plug or a via plug, and the via plug 7 may be formed on the metal plug.

Here, the insulating film 6 and the via plug 7 in FIG. 1B will be described. In FIG. 1B, a via hole has been formed with a positional deviation with respect to the left wiring 3 when the via hole is formed inside the second interlayer insulating film 4 and the third interlayer insulating film 5. Because of the positional deviation, the insulating film 6 is also formed on a surface of the first interlayer insulating film 2. Furthermore, the first metal layer 7a is also formed on a side surface of the left wiring 3. As a result, the second metal layer 7b is formed on the side surfaces of the second interlayer insulating film 4 and the third interlayer insulating film 5 and on the surface of the first interlayer insulating film 2 with the insulating film 6 and the first metal layer 7a placed in between, and is formed on the upper surface and the side surface of the left wiring 3 with the first metal layer 7a placed in between. The semiconductor device according to the present embodiment may have the structure shown in FIG. 1A, or may have the structure shown in FIG. 1B.

The semiconductor device according to the present embodiment may be any semiconductor device, for example, a three-dimensional semiconductor memory. In this case, the three-dimensional semiconductor memory may be formed by bonding an array chip including a memory cell array and a circuit chip including a CMOS circuit. In addition, the wiring 3 and the via plug 7 in FIG. 1A or 1B may be provided in the array chip, or may be provided in the circuit chip. In addition, the semiconductor device according to the present embodiment may not include the substrate 1. An example of such a semiconductor device will be described below in a third embodiment.

Figure 2A:
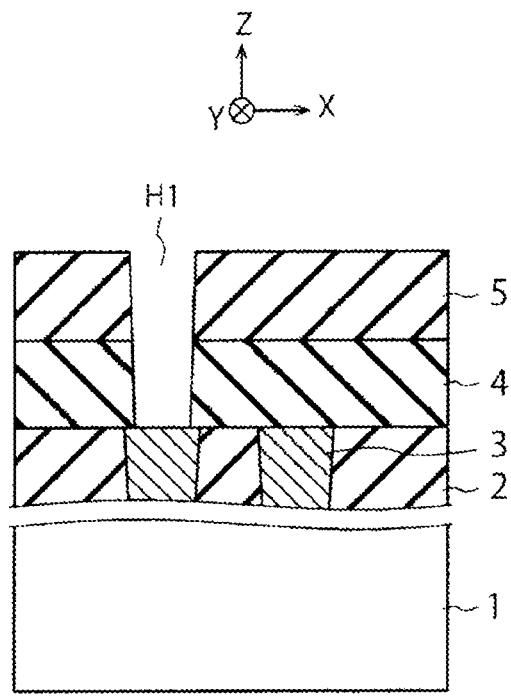
FIGS. 2A and 2B illustrate cross-sectional views of a structure for explaining aspects of a manufacturing method of the semiconductor device according to the first embodiment.

FIGS. 2A to 7B illustrate cross-sectional views of structures to show a manufacturing method of the semiconductor device according to the first embodiment. FIGS. 2A and 2B illustrate cross-sectional views corresponding to FIGS. 1A and 1B, respectively. This also applies to FIGS. 3A to 7B. Hereinafter, the manufacturing method of the semiconductor device according to the present embodiment will be described with reference to FIGS. 2A, 3A, 4A and so forth. In this description, FIGS. 2B, 3B, 4B and so forth are also referred to as appropriate.

Figure 2B:
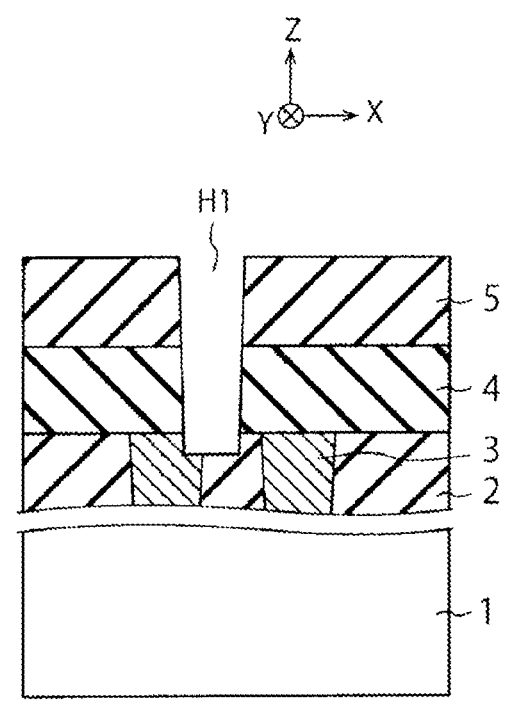

First, the first interlayer insulating film 2 is formed on the substrate 1, the plurality of wirings 3 are formed in the first interlayer insulating film 2, the second interlayer insulating film 4 and the third interlayer insulating film 5 are formed successively on the first interlayer insulating film 2 and the wirings 3 (FIG. 2A). Next, a via hole H1 reaching any of the wirings 3 is formed in the second interlayer insulating film 4 and the third interlayer insulating film 5 (FIG. 2A). As a result, the upper surface of the wiring 3 is exposed in the via hole H1. The wiring 3 is, for example, a Cu wiring. The via hole H1 is an example of an opening. In FIG. 2B, the via hole H1 has a positional deviation with respect to the wiring 3, and the upper surface and the side surface of the wiring 3 are exposed in the via hole H1.

Figure 3A:
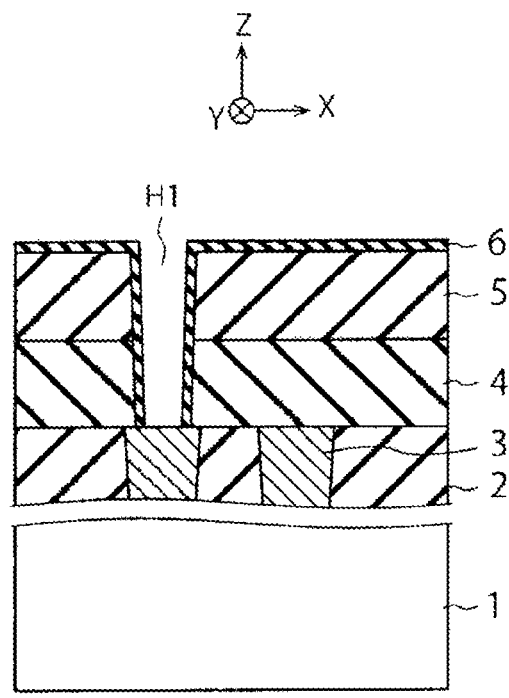
FIGS. 3A and 3B illustrate cross-sectional views of a structure for explaining aspects of a manufacturing method of the semiconductor device according to the first embodiment.
Figure 3B:
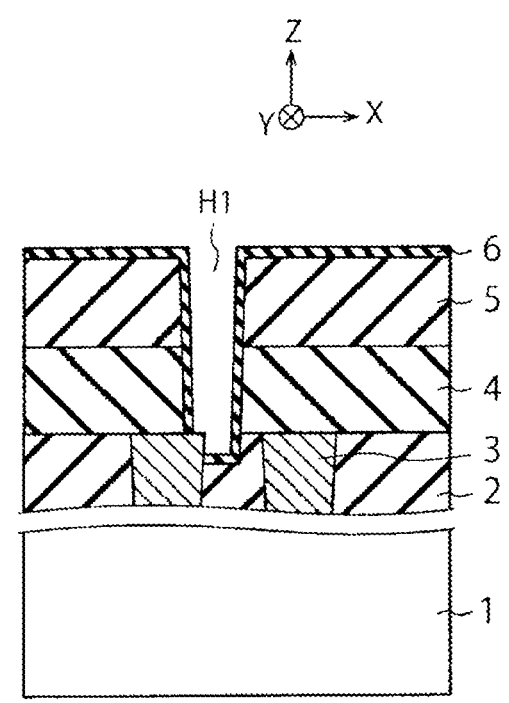

Next, the insulating film 6 is formed in the via hole H1 (FIG. 3A). The insulating film 6 is, for example, an $Al_2O_3$ film. In the present embodiment, the insulating film 6, which is an $Al_2O_3$ film, is formed on the surface of the via hole H1 by LAM. According to the contents of the insulating film 6, the insulating film 6 may be selectively formed on the surfaces of the second interlayer insulating film 4 and the third interlayer insulating film 5 between the surfaces of the second interlayer insulating film 4 and the third interlayer insulating film 5 and the surface of the wiring 3. In FIG. 3B, the insulating film 6 may be selectively formed on the surfaces of the first interlayer insulating film 2, the second interlayer insulating film 4 and the third interlayer insulating film 5.

Figure 4A:
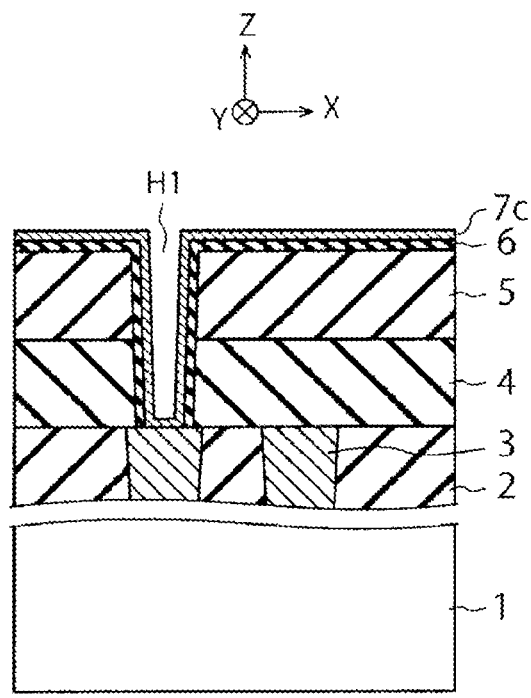
FIGS. 4A and 4B illustrate cross-sectional views of a structure for explaining aspects of a manufacturing method of the semiconductor device according to the first embodiment.
Figure 4B:
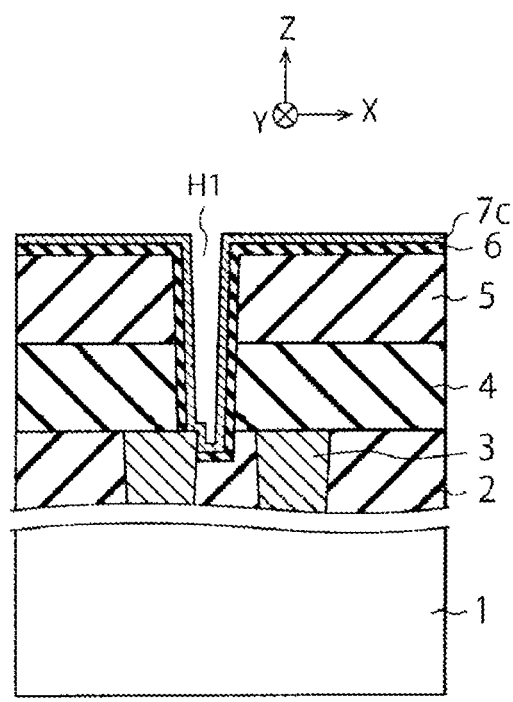

Next, a $B_2H_6$ layer 7c is formed in the via hole H1 with the insulating film 6 placed in between (FIG. 4A). B represents boron and H represents hydrogen. The $B_2H_6$ layer 7c is formed on the side surfaces of the second interlayer insulating film 4 and the third interlayer insulating film 5 with the insulating film 6 placed in between, and is formed on the upper surface of the wiring 3 without interposition of the insulating film 6. In FIG. 4B, the $B_2H_6$ layer 7c is also formed on the side surface of the wiring 3.

Figure 5A:
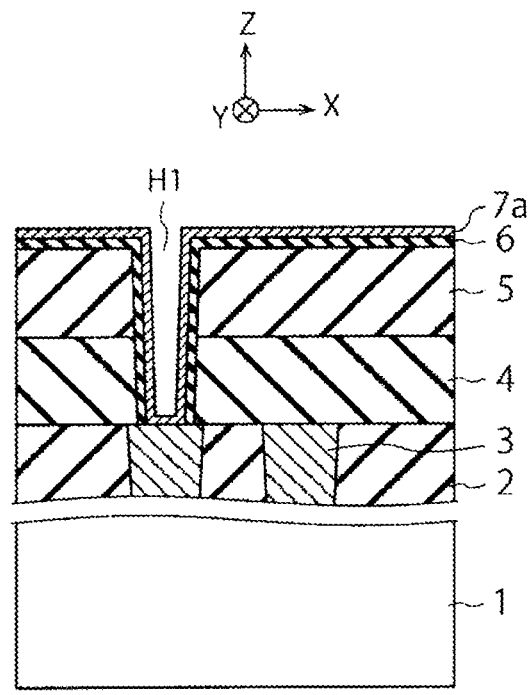
FIGS. 5A and 5B illustrate cross-sectional views of a structure for explaining aspects of a manufacturing method of the semiconductor device according to the first embodiment.
Figure 5B:
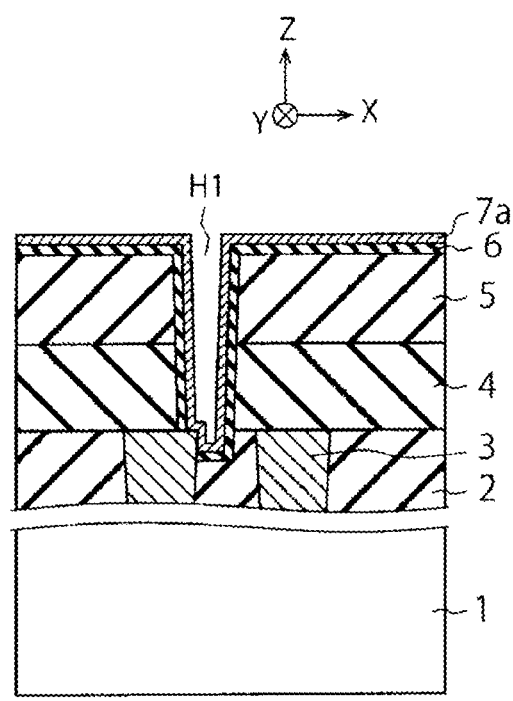

Next, the $B_2H_6$ layer 7c is reduced by the $WF_6$ gas to replace the $B_2H_6$ layer 7c with the first metal layer 7a (FIG. 5A). In this context, W represents tungsten, and F represents fluorine. The first metal layer 7a is, for example, a tungsten liner layer. The first metal layer 7a is formed on the side surfaces of the second interlayer insulating film 4 and the third interlayer insulating film 5 with the insulating film 6 placed in between, and is formed on the upper surface of the wiring 3 without interposition of the insulating film 6. In FIG. 5B, the first metal layer 7a is also formed on the side surface of the wiring 3.

Figure 6A:
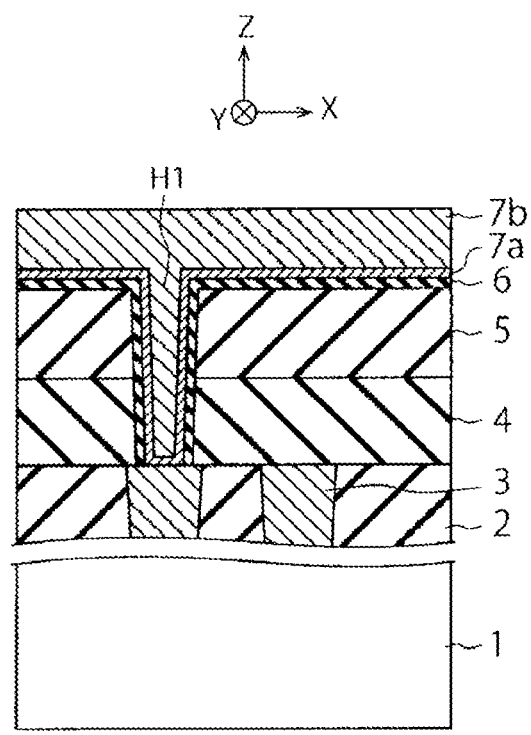
FIGS. 6A and 6B illustrate cross-sectional views of a structure for explaining aspects of a manufacturing method of the semiconductor device according to the first embodiment.
Figure 6B:
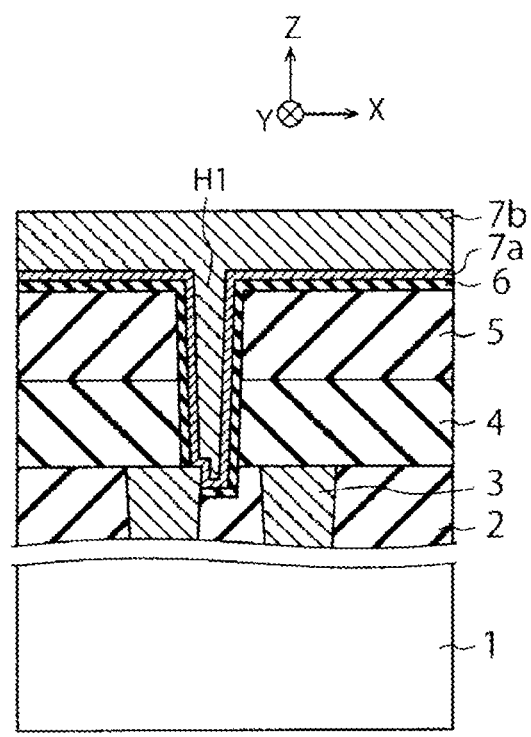

Next, the second metal layer 7b is formed on the entire surface of the substrate 1 by Chemical Vapor Deposition (CVD) (FIG. 6A). As a result, the second metal layer 7b is formed in the via hole H1 with the insulating film 6 and the first metal layer 7a placed in between. The second metal layer 7b is, for example, a tungsten plug material layer. The second metal layer 7b is formed on the side surfaces of the second interlayer insulating film 4 and the third interlayer insulating film 5 with the insulating film 6 and the first metal layer 7a placed in between, and is formed on the upper surface of the wiring 3 with the first metal layer 7a placed in between. In FIG. 6B, the second metal layer 7b is also formed on the side surface of the wiring 3 with the first metal layer 7a placed in between.

Figure 7A:
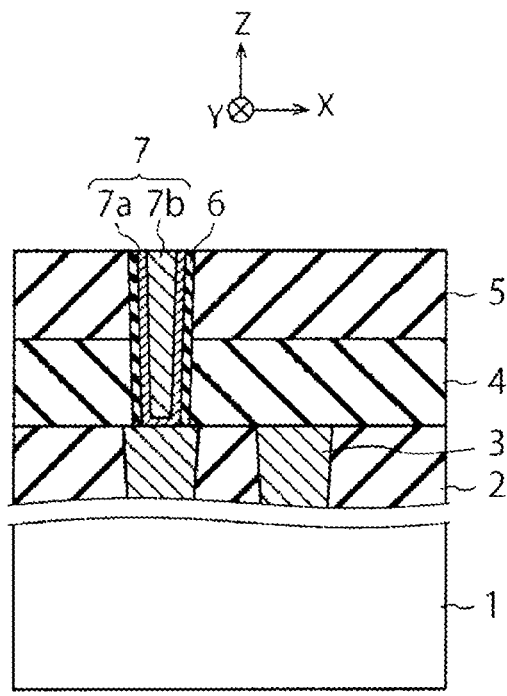
FIGS. 7A and 7B illustrate cross-sectional views of a structure for explaining aspects of a manufacturing method of the semiconductor device according to the first embodiment.
Figure 7B:
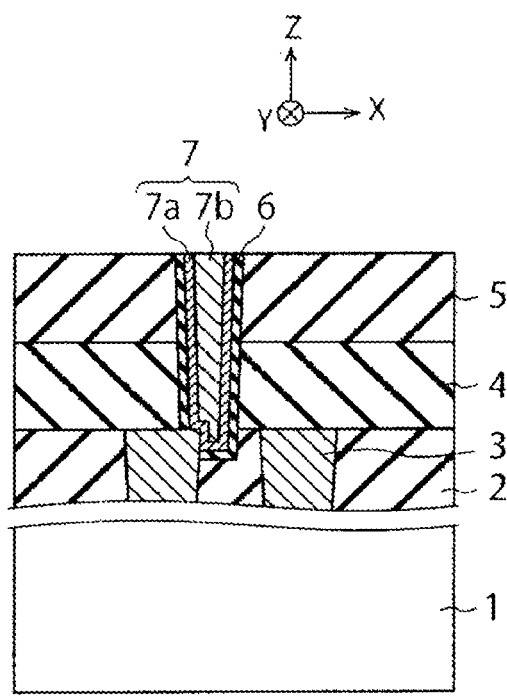

Next, the surface of the second metal layer 7b is planarized by Chemical Mechanical Polishing (CMP) (FIG. 7A). As a result, the second metal layer 7b, the first metal layer 7a, and the insulating film 6 outside the via hole H1 are removed, and the via plug 7 is formed in the via hole H1. The via plug 7 according to the present embodiment is abutted against the wiring 3 and is electrically connected to the wiring 3. This also applies to FIG. 7B.

Thereafter, various interlayer insulating films, wiring layers, plug layers, and the like are formed on the substrate 1. In this way, the semiconductor device according to the present embodiment is manufactured.

As described above, the via plug 7 according to the present embodiment is formed of tungsten (W) and is formed directly on the wiring 3 formed of copper (Cu). Hereinafter, further details of the via plug 7 will be described with reference to FIGS. 1A, 6A, and the like.

In general, when a via plug is formed by using tungsten, the via plug includes a barrier metal layer that is a titanium nitride (TiN) film and a plug material layer that is a tungsten layer. This results in a problem that, in this case, when the via plug is formed on the Cu wiring, the Cu wiring and the TiN film are likely to react with each other.

In the present embodiment, the tungsten layer (the via plug 7) is formed in the via hole H1 with the $Al_2O_3$ film (the insulating film 6) placed in between (FIG. 6A). According to the existence of the insulating film 6, it is possible to form the tungsten layer without using the TiN film, and it is possible to avoid the problem that the Cu wiring reacts with the TiN film. Furthermore, a function achieved by the TiN film can be achieved by the $Al_2O_3$ film. Further, by selectively forming the insulating film 6 on the surfaces of the second interlayer insulating film 4 and the third interlayer insulating film 5, the tungsten layer can be abutted against the Cu wiring, and the tungsten layer can be electrically connected to the Cu wiring.

In the case of FIG. 1B, the left wiring 3 and the right wiring 3 may be short-circuited via the via plug 7 since the via plug 7 is position deviated with respect to the wiring 3. However, in the present embodiment, since the insulating film 6 is formed between the via plug 7 and the right wiring 3, such short circuit is less likely to occur.

As described above, the semiconductor device according to the present embodiment includes the insulating film 6 containing aluminum (Al) and oxygen (O) and the via plug 7 containing tungsten on the wiring 3 containing Cu. According to the present embodiment, it is less likely to cause the reaction between the wiring 3 and the via plug 7.

The insulating film 6 may be an insulating film other than the $Al_2O_3$ film. An example of the insulating film 6 will be described in a second embodiment.

Second Embodiment

Figure 8A:
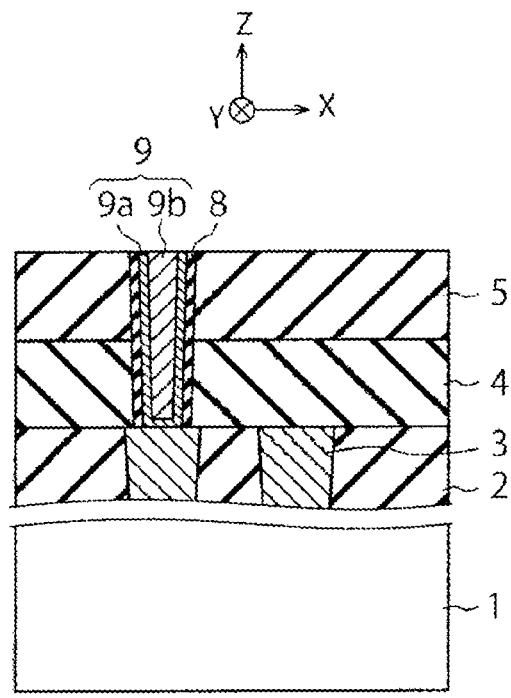
FIGS. 8A and 8B illustrate cross-sectional views of a semiconductor device according to a second embodiment.
Figure 8B:
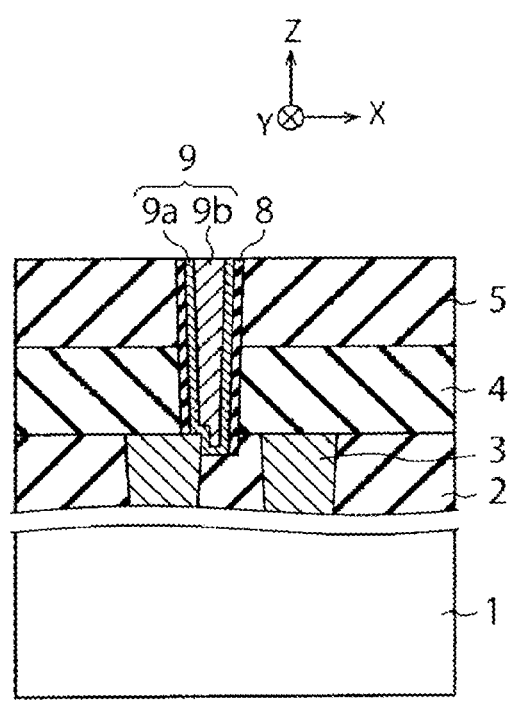

FIGS. 8A and 8B illustrate cross-sectional views of a semiconductor device according to the second embodiment.

As shown in both FIGS. 8A and 8B, the semiconductor device according to the present embodiment includes the substrate 1, the first interlayer insulating film 2, the plurality of wirings 3, the second interlayer insulating film 4, the third interlayer insulating film 5, an insulating film 8, and a via plug 9. The second interlayer insulating film 4 and the third interlayer insulating film 5 are examples of a first insulating film, the insulating film 8 is an example of a second insulating film, and the via plug 9 is an example of a plug. The via plug 9 includes a first metal layer 9a, which is an example of a first layer, and a second metal layer 9b, which is an example of a second layer. Details of the substrate 1, the first interlayer insulating film 2, the plurality of wirings 3, the second interlayer insulating film 4, and the third interlayer insulating film 5 in the present embodiment are the same as those in the first embodiment.

FIG. 8A shows the semiconductor device in a case where the via plug 9 has been formed without a positional deviation with respect to the wiring 3, and FIG. 8B shows the semiconductor device in a case where the via plug 9 has been formed with a positional deviation with respect to the wiring 3. Hereinafter, a structure of the semiconductor device according to the embodiment will be described with reference to FIG. 8A. In this description, FIG. 8B may also be referred as appropriate. Description of those matters common with the first embodiment will generally be omitted.

The insulating film 8 and the via plug 9 are formed on one of the wirings 3 and are inside the second interlayer insulating film 4 and third interlayer insulating film 5. FIG. 8A shows the insulating film 8 and the via plug 9 formed on the left wiring 3. The left wiring 3 in FIG. 8A is an example of a first wiring. The via plug 9 in the present embodiment extends in the Z direction on the left wiring 3. The insulating film 8 in the present embodiment is a silicon-based insulating film that contains silicon (Si) and oxygen (O), and is, for example, a silicon oxide film (a $SiO_2$ film). On the other hand, the via plug 9 includes, for example, a first metal layer 9a and a second metal layer 9b. The first metal layer 9a in the present embodiment is a metal layer containing tungsten (W), and is, for example, a tungsten liner layer. In addition, the second metal layer 9b in the present embodiment is a metal layer containing tungsten (W), and is, for example, a tungsten plug material layer. As described above, the via plug 9 in the present embodiment is, for example, a tungsten layer, which is similar to the via plug 7 in the first embodiment. In this case, the first metal layer 9a (the tungsten liner layer) and the second metal layer 9b (the tungsten plug material layer) may not be readily distinguishable from each other.

As will be described below, the insulating film 8 and the via plug 9 in the present embodiment are formed by forming a via hole reaching any of the wirings 3 in the second interlayer insulating film 4 and forming the third interlayer insulating film 5, the insulating film 8, the first metal layer 9a, and the second metal layer 9b sequentially in the via hole. As a result, the via plug 9 is formed inside the second interlayer insulating film 4 and the third interlayer insulating film 5 with the insulating film 8 placed in between, and the second metal layer 9b is formed in the second interlayer insulating film 4 and the third interlayer insulating film 5 with the insulating film 8 and the first metal layer 9a placed in between.

However, the insulating film 8 in the present embodiment is formed on surfaces of the second interlayer insulating film 4 and the third interlayer insulating film 5 and a surface of the wiring 3, and then is removed from the surface of the wiring 3. Therefore, the insulating film 8 of FIG. 8A is formed on side surfaces of the second interlayer insulating film 4 and the third interlayer insulating film 5, but is not formed on an upper surface of the wiring 3. More precisely, the insulating film 6 of FIG. 8A is only abutted against a part of the upper surface of the left wiring 3 and is not formed on the entire upper surface of the left wiring 3.

As a result, the via plug 9 in the present embodiment is abutted against the upper surface of the wiring 3, and is electrically connected to the wiring 3. The via plug 9 of FIG. 8A is formed on the side surfaces of the second interlayer insulating film 4 and the third interlayer insulating film 5 with the insulating film 8 placed in between, and is formed on the upper surface of the wiring 3 without interposition of the insulating film 8.

Specifically, the first metal layer 9a of FIG. 8A is formed on the side surfaces of the second interlayer insulating film 4 and the third interlayer insulating film 5 with the insulating film 8 placed in between, and is formed on the upper surface of the left wiring 3 without interposition of the insulating film 8. Further, the second metal layer 9b in FIG. 8A is formed on the side surfaces of the second interlayer insulating film 4 and the third interlayer insulating film 5 with the insulating film 8 and the first metal layer 9a placed in between, and is formed on the upper surface of the left wiring 3 with the first metal layer 9a placed in between.

Here, the insulating film 8 and the via plug 9 in FIG. 8B will be described. In FIG. 8B, a via hole has been formed with a positional deviation with respect to the left wiring 3 when the via hole was formed inside the second interlayer insulating film 4 and the third interlayer insulating film 5. Because of the positional deviation, the insulating film 8 is also formed on a side surface of the first interlayer insulating film 2. Further, the first metal layer 9a is also formed on a side surface of the left wiring 3. As a result, the second metal layer 9b is formed on the side surfaces of the second interlayer insulating film 4 and the third interlayer insulating film 5 and the side surface of the first interlayer insulating film 2 with the insulating film 8 and the first metal layer 9a placed in between, and is formed on the upper surface and the side surface of the left wiring 3 with the first metal layer 9a placed in between. It should be noted that the insulating film 8 in FIG. 8B is removed from the upper surface of the first interlayer insulating film 2. The semiconductor device according to the present embodiment may have the structure shown in FIG. 8A, or may have the structure shown in FIG. 8B.

The semiconductor device according to the present embodiment may be any semiconductor device, for example, a three-dimensional semiconductor memory. In this case, the three-dimensional semiconductor memory may be formed by bonding an array chip including a memory cell array and a circuit chip including a CMOS circuit. In addition, the wiring 3 and the via plug 7 in FIG. 8A or 8B may be provided in the array chip, or may be provided in the circuit chip. In addition, the semiconductor device according to the present embodiment may not include the substrate 1. An example of such a semiconductor device will be described below in a third embodiment.

Figure 9A:
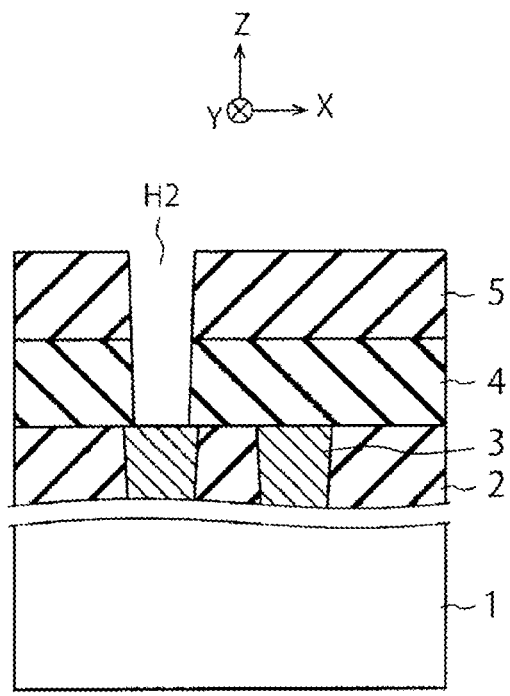
FIGS. 9A and 9B illustrate cross-sectional views of a structure for explaining aspects of a manufacturing method of the semiconductor device according to the second embodiment.

FIGS. 9A to 14B illustrate cross-sectional views of structures to show a manufacturing method of the semiconductor device according to the second embodiment. FIGS. 9A and 9B illustrate cross-sectional views corresponding to FIGS. 8A and 8B, respectively. This also applies to FIGS. 10A to 14B. Hereinafter, the manufacturing method of the semiconductor device according to the present embodiment will be described with reference to FIGS. 9A, 10A, 11A and so forth. In this description, FIGS. 9B, 10B, 11B and so forth are also referred to as appropriate. Description of those matters in common with the first embodiment will be omitted.

Figure 9B:
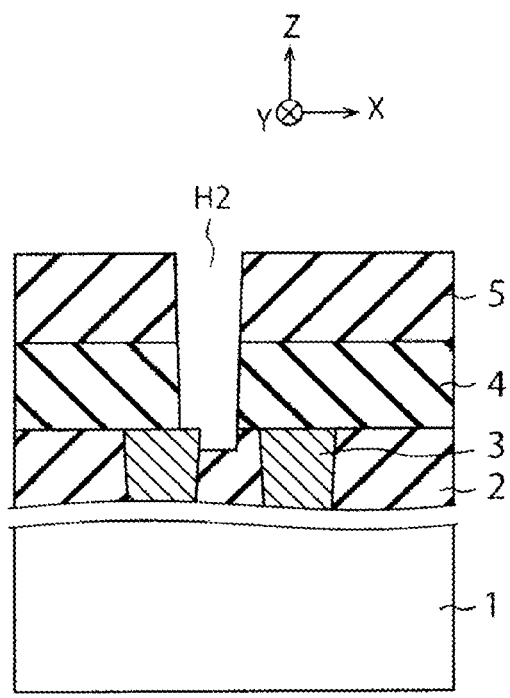

First, the first interlayer insulating film 2 is formed on the substrate 1, the plurality of wirings 3 are formed in the first interlayer insulating film 2, the second interlayer insulating film 4 and the third interlayer insulating film 5 are formed successively on the first interlayer insulating film 2 and the wirings 3 (FIG. 9A). Next, a via hole H2 reaching any of the wirings 3 is formed in the second interlayer insulating film 4 and the third interlayer insulating film 5 (FIG. 9A). As a result, the upper surface of the wiring 3 is exposed in the via hole H2. The wiring 3 is, for example, a Cu wiring. The via hole H2 is an example of an opening. In FIG. 9B, the via hole H2 has a positional deviation with respect to the wiring 3, and the upper surface and the side surface of the wiring 3 are exposed in the via hole H2.

Figure 10A:
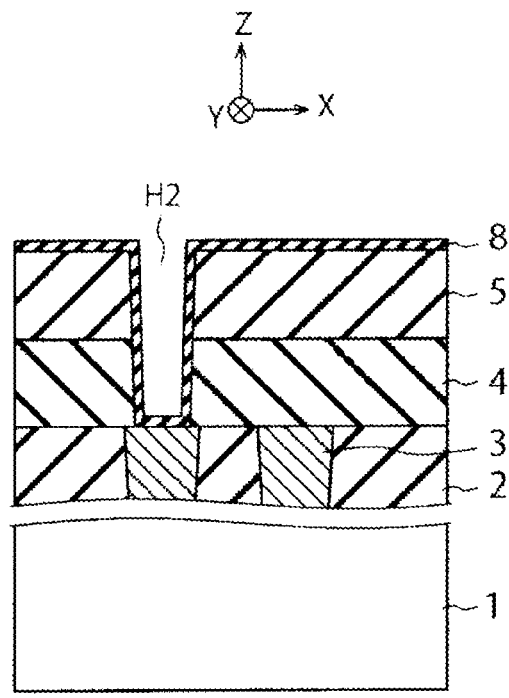
FIGS. 10A and 10B illustrate cross-sectional views of a structure for explaining aspects of a manufacturing method of the semiconductor device according to the second embodiment.
Figure 10B:
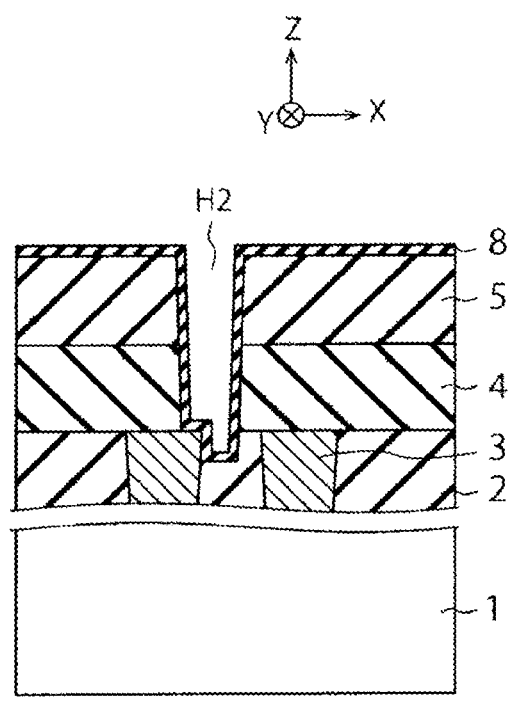

Next, the insulating film 8 is formed in the via hole H2 (FIG. 10A). The insulating film 8 is, for example, an $SiO_2$ film. In the present embodiment, the insulating film 8, which is a $SiO_2$ film, is formed on the surface of the via hole H2 by CVD. As a result, the insulating film 8 is formed on the surfaces of the second interlayer insulating film 4 and the third interlayer insulating film 5 and on the surface of the wiring 3. In FIG. 10B, the insulating film 8 is formed on the surfaces of the first interlayer insulating film 2, the second interlayer insulating film 4 and the third interlayer insulating film 5 and on the surface of the wiring 3.

Figure 11A:
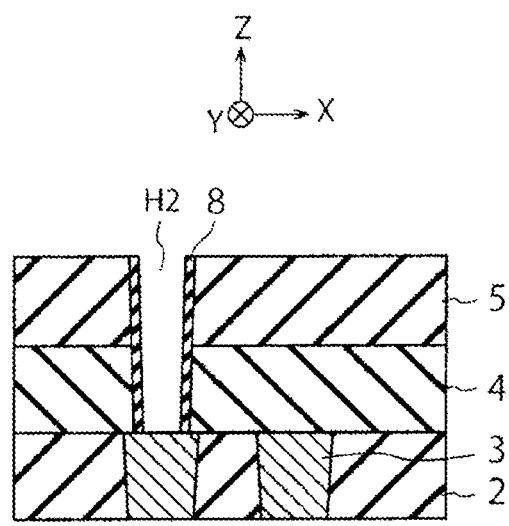
FIGS. 11A and 11B illustrate cross-sectional views of a structure for explaining aspects of a manufacturing method of the semiconductor device according to the second embodiment.
Figure 11B:
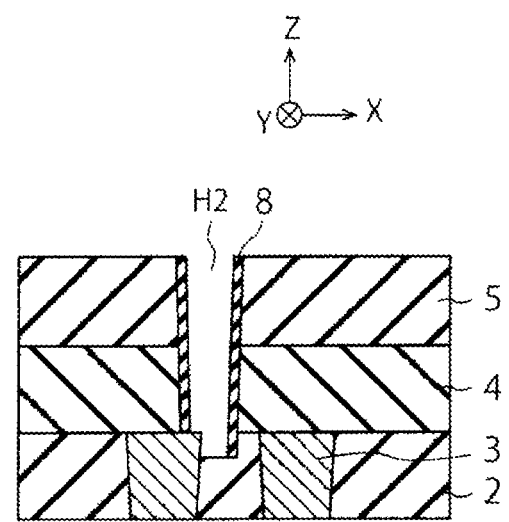

Next, the insulating film 8 is removed from the bottom of the via hole H2 by Reactive Ion Etching (RIE) (FIG. 11A). As a result, the insulating film 8 is removed from the upper surface of the wiring 3 in the via hole H2, and the upper surface of the wiring 3 is exposed in the via hole H2. In FIG. 11B, the insulating film 8 is removed from the upper surface and the side surface of the wiring 3 in the via hole H2 and the upper surface of the first interlayer insulating film 2, and the upper surface and the side surface of the wiring 3 and the upper surface of the first interlayer insulating film 2 are exposed in the via hole H2.

Figure 12A:
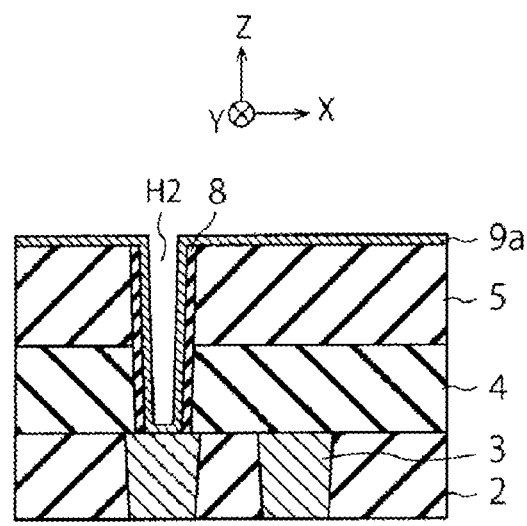
FIGS. 12A and 12B illustrate cross-sectional views of a structure for explaining aspects of a manufacturing method of the semiconductor device according to the second embodiment.
Figure 12B:
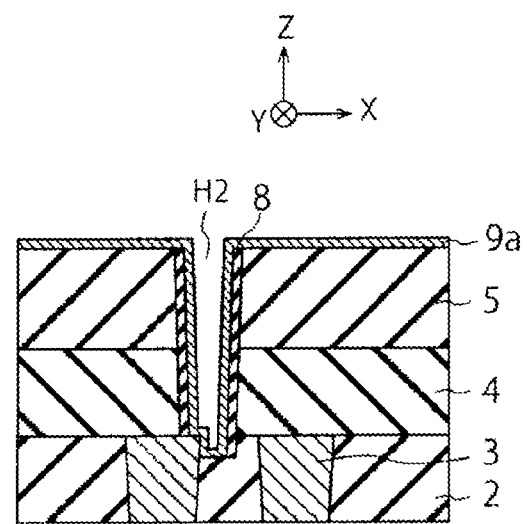

Next, the first metal layer 9a is conformally formed on the entire surface of the substrate 1 (FIG. 12A). As a result, the first metal layer 9a is formed on the side surfaces of the second interlayer insulating film 4 and the third interlayer insulating film 5 with the insulating film 8 placed in between, and is formed on the exposed upper surface of the wiring 3 without interposition of the insulating film 8. The first metal layer 9a is, for example, a tungsten liner layer. In FIG. 12B, the first metal layer 9a is also formed on the exposed side surface of the wiring 3.

Figure 13A:
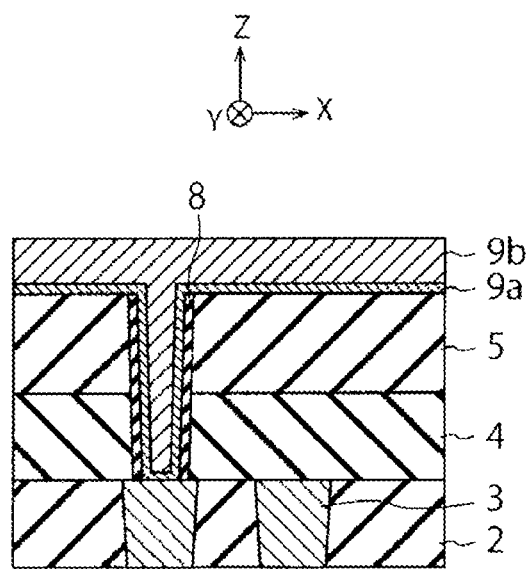
FIGS. 13A and 13B illustrate cross-sectional views of a structure for explaining aspects of a manufacturing method of the semiconductor device according to the second embodiment.
Figure 13B:
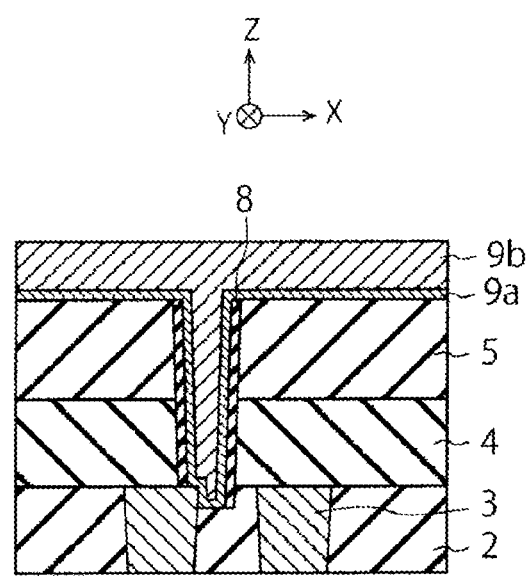

Next, the second metal layer 9b is formed on the entire surface of the substrate 1 by CVD (FIG. 13A). As a result, the second metal layer 9b is formed in the via hole H2 with the insulating film 8 and the first metal layer 8a placed in between. The second metal layer 9b is, for example, a tungsten plug material layer. The second metal layer 9b is formed on the side surfaces of the second interlayer insulating film 4 and the third interlayer insulating film 5 with the insulating film 8 and the first metal layer 9a placed in between, and is formed on the upper surface of the wiring 3 with the first metal layer 9a placed in between. In FIG. 13B, the second metal layer 9b is also formed on the side surface of the wiring 3 with the first metal layer 9a placed in between.

Figure 14A:
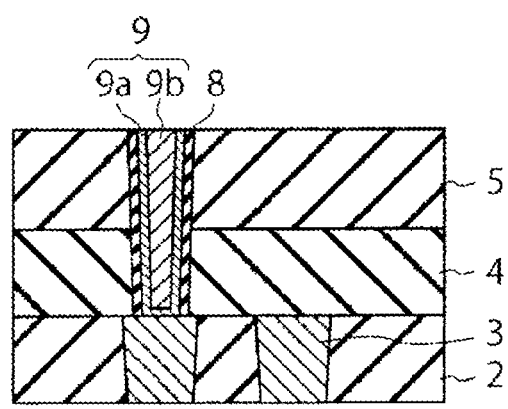
FIGS. 14A and 14B illustrate cross-sectional views of a structure for explaining aspects of a manufacturing method of the semiconductor device according to the second embodiment.
Figure 14B:
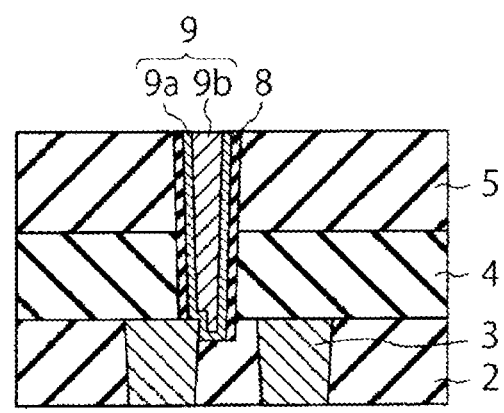

Next, the surface of the second metal layer 9b is planarized by CMP (FIG. 14A). As a result, the second metal layer 9b, the first metal layer 9a, and the insulating film 8 outside the via hole H2 are removed, and the via plug 9 is formed in the via hole H2. The via plug 9 in the present embodiment is abutted against the wiring 3 and is electrically connected to the wiring 3. This also applies to FIG. 14B.

In the present embodiment, instead of forming the via plug 9 by sequentially forming the first tungsten layer (the first metal layer 9a) and the second tungsten layer (the second metal layer 9b), a single tungsten layer may form the via plug 9. In this case, two steps of forming the first and the second tungsten layers are replaced by one step of forming the single tungsten layer.

Thereafter, various interlayer insulating films, wiring layers, plug layers, and the like are formed on the substrate 1. In this way, the semiconductor device according to the present embodiment is manufactured.

As described above, the via plug 9 in the present embodiment is formed of tungsten (W) and is formed directly on the wiring 3 formed of copper (Cu). Hereinafter, further details of the via plug 9 will be described with reference to FIGS. 8A, 13A, and the like.

In the present embodiment, the tungsten layer (the via plug 9) is formed in the via hole H2 with the $SiO_2$ film (the insulating film 8) placed in between (FIG. 13A). As a result, the tungsten layer can be formed without using the TiN film, and the same effect as that of the first embodiment can be achieved by using the $SiO_2$ film instead of a $Al_2O_3$ film. Furthermore, by removing the insulating film 8 from the surface of the wiring 3 and then forming the plug 9 on the wiring 3, the tungsten layer can be abutted against the Cu wiring, and the tungsten layer can be electrically connected to the Cu wiring.

As described above, the semiconductor device according to the present embodiment includes the insulating film 8 containing silicon and oxygen and the via plug 9 containing tungsten on the wiring 3 containing Cu. According to the present embodiment, the reaction between the wiring 3 and the via plug 9 is less likely to occur. The insulating film 8 can be an insulating film other than the $SiO_2$ film.

Third Embodiment

Figure 15:
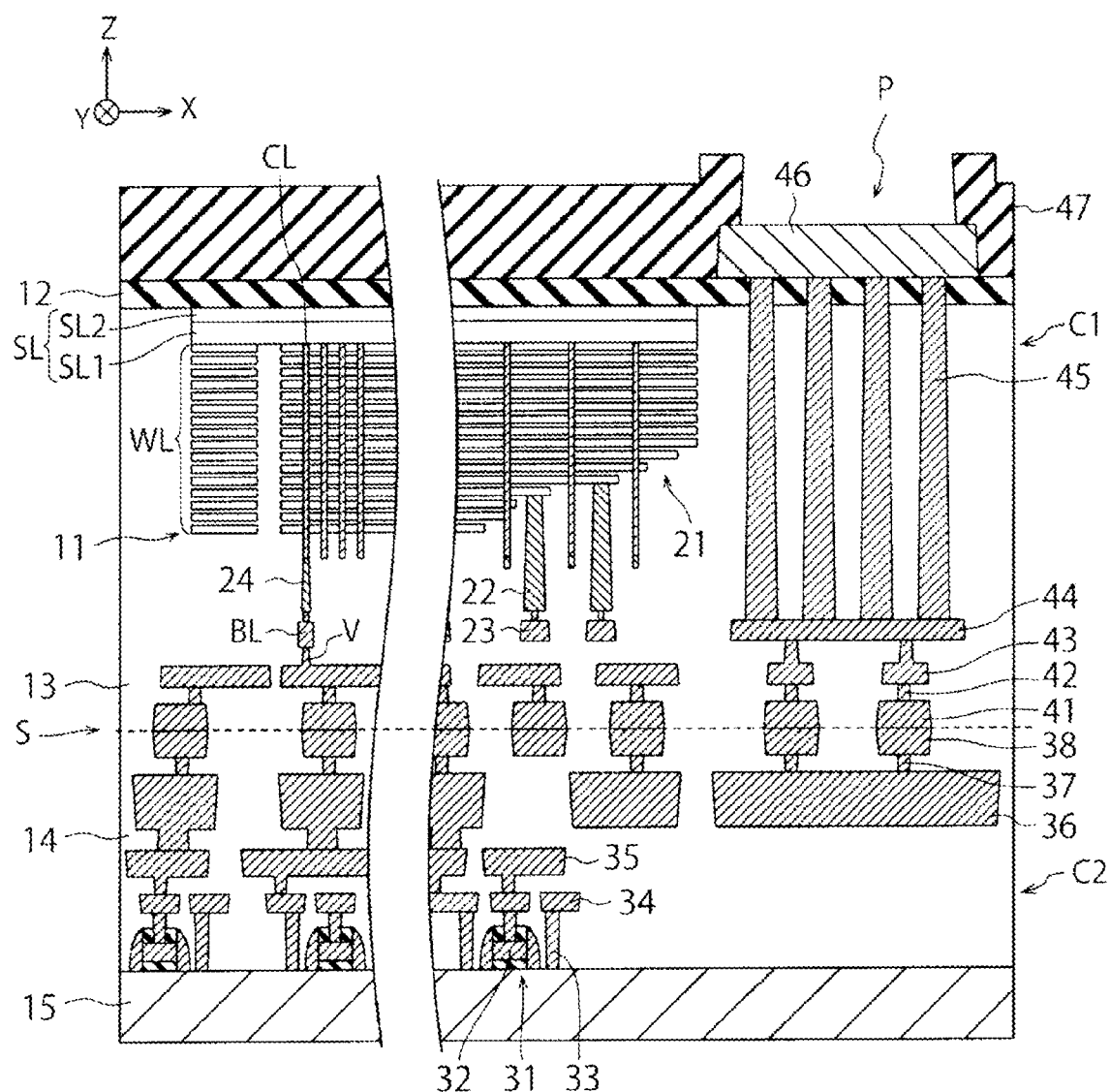
FIG. 15 illustrates a cross-sectional view of a semiconductor device according to a third embodiment.

FIG. 15 illustrates a cross-sectional view of a semiconductor device according to a third embodiment. The semiconductor device of FIG. 15 is a three-dimensional memory in which an array chip C1 and a circuit chip C2 are bonded.

The array chip C1 includes a memory cell array 11 including a plurality of memory cells arranged in three dimensions, an insulating film 12 on the memory cell array 11, and an interlayer insulating film 13 under the memory cell array 11. The insulating film 12 is, for example, a silicon oxide film or a silicon nitride film. The interlayer insulating film 13 is, for example, a stacked film including a silicon oxide film or a silicon oxide film and another insulating film.

The circuit chip C2 is provided below the array chip C1. A reference numeral S denotes a bonding surface between the array chip C1 and the circuit chip C2. The circuit chip C2 includes an interlayer insulating film 14 and a substrate 15 below the interlayer insulating film 14. The interlayer insulating film 14 is, for example, a stacked film including a silicon oxide film or a silicon oxide film and another insulating film. The substrate 15 is, for example, a semiconductor substrate such as a silicon substrate. FIG. 15 shows an X direction and a Y direction, which are perpendicular to each other and are in parallel to a surface of the substrate 15, and a Z direction that is perpendicular to the surface of the substrate 15. The Y direction is an example of a first direction, and the X direction is an example of a second direction intersecting the first direction, and the Z direction is an example of a third direction intersecting the first and the second directions.

The array chip C1 includes a plurality of word lines WL and source lines SL as a plurality of electrode layers in the memory cell array 11. FIG. 15 shows a staircase structure portion 21 of the memory cell array 11. Each word line WL is electrically connected to a word wiring layer 23 via a contact plug 22. Each columnar portion CL penetrating the plurality of word lines WL is electrically connected to a bit line BL via a via plug 24, and is electrically connected to the source lines SL. The source lines SL include a first layer SL1 which is a semiconductor layer and a second layer SL2 which is a metal layer. A reference sign V shows a via plug provided under the bit line BL.

The circuit chip C2 includes a plurality of transistors 31. Each transistor 31 includes a gate electrode 32 provided on the substrate 15 via a gate insulating film, a source diffusion layer (not shown), and a drain diffusion layer (not shown) provided in the substrate 15. In addition, the circuit chip C2 includes a plurality of contact plugs 33 provided on source diffusion layers or drain diffusion layers of the transistors 31, wiring layers 34 provided on the contact plugs 33 and including a plurality of wirings, and wiring layers 35 provided on the wiring layers 34 and including a plurality of wirings.

The circuit chip C2 further includes wiring layers 36 provided on the wiring layers 35 and including a plurality of wirings, a plurality of via plugs 37 provided on the wiring layers 36, and a plurality of metal pads 38 provided on the via plugs 37. The metal pads 38 are, for example, Cu (copper) layers or Al (aluminum) layers. The circuit chip C2 functions as a control circuit (a logic circuit) that controls the operation of the array chip C1. The control circuit includes the transistors 31 and the like, and is electrically connected to the metal pads 38.

The array chip C1 includes a plurality of metal pads 41 provided on the metal pads 38, and a plurality of via plugs 42 provided on the metal pads 41. The array chip C1 further includes wiring layers 43 provided on the via plugs 42 and including a plurality of wirings, and wiring layers 44 provided on the wiring layers 43 and including a plurality of wirings. The metal pads 41 are, for example, Cu layers or Al layers. Via plugs V are provided in the wiring layers 43.

The array chip C1 further includes a plurality of via plugs 45 provided on the wiring layers 44, a metal pad 46 provided on the via plugs 45 and the insulating film 12, and a passivation film 47 provided on the metal pad 46 and the insulating film 12. The metal pad 46 is, for example, a Cu layer or an Al layer, and functions as an external connection pad (a bonding pad) of the semiconductor device of FIG. 15. The passivation film 47 is, for example, an insulating film such as a silicon oxide film, and has an opening P that exposes on the upper surface of the metal pad 46. The metal pad 46 may be connected to a mounting substrate or another device through the opening P by a bonding wire, a solder ball, a metal bump, and the like.

Figure 16:
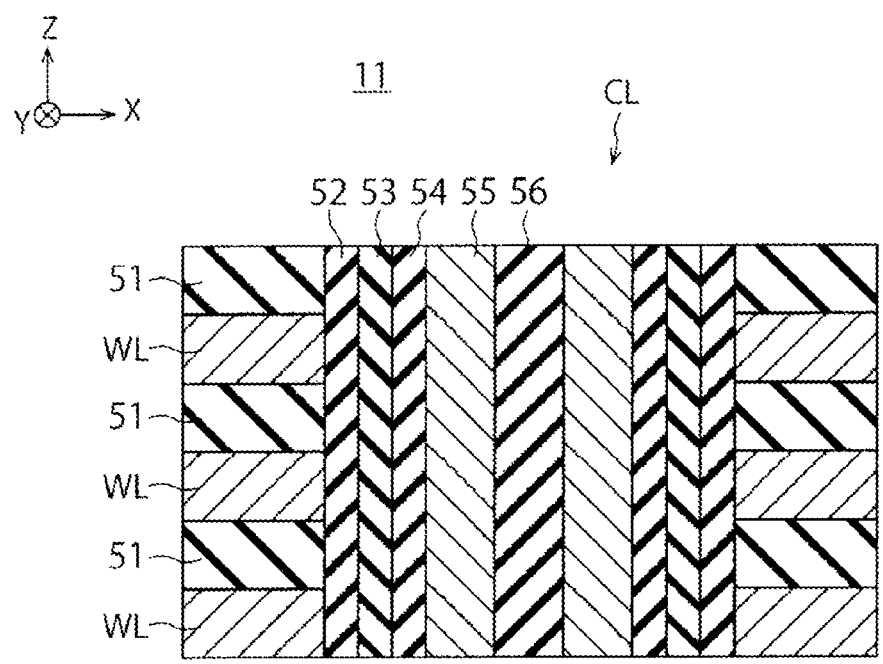
FIG. 16 illustrates a cross-sectional view of a columnar portion of the semiconductor device according to the third embodiment.

FIG. 16 illustrates a cross-sectional view of a columnar portion CL according to the third embodiment.

As shown in FIG. 16, the memory cell array 11 includes a plurality of word lines WL and a plurality of insulating layers 51 alternately stacked on the interlayer insulating film 13 (FIG. 15). The word line WL is, for example, a tungsten (W) layer. The insulating layer 51 is, for example, a silicon oxide film.

The columnar portion CL successively includes a block insulating film 52, a charge storage layer 53, a tunnel insulating film 54, a channel semiconductor layer 55, and a core insulating film 56. The charge storage layer 53 is, for example, a silicon nitride film, and is formed on side surfaces of the word line WL and the insulating layer 51 with the block insulating film 52 placed in between. The charge storage layer 53 may be a semiconductor layer such as a polysilicon layer. The channel semiconductor layer 55 is, for example, a polysilicon layer, and is formed on a side surface of the charge storage layer 53 with the tunnel insulating film 54 placed in between. The block insulating film 52, the tunnel insulating film 54, and the core insulating film 56 are, for example, silicon oxide films or metal insulating films.

Figure 17:
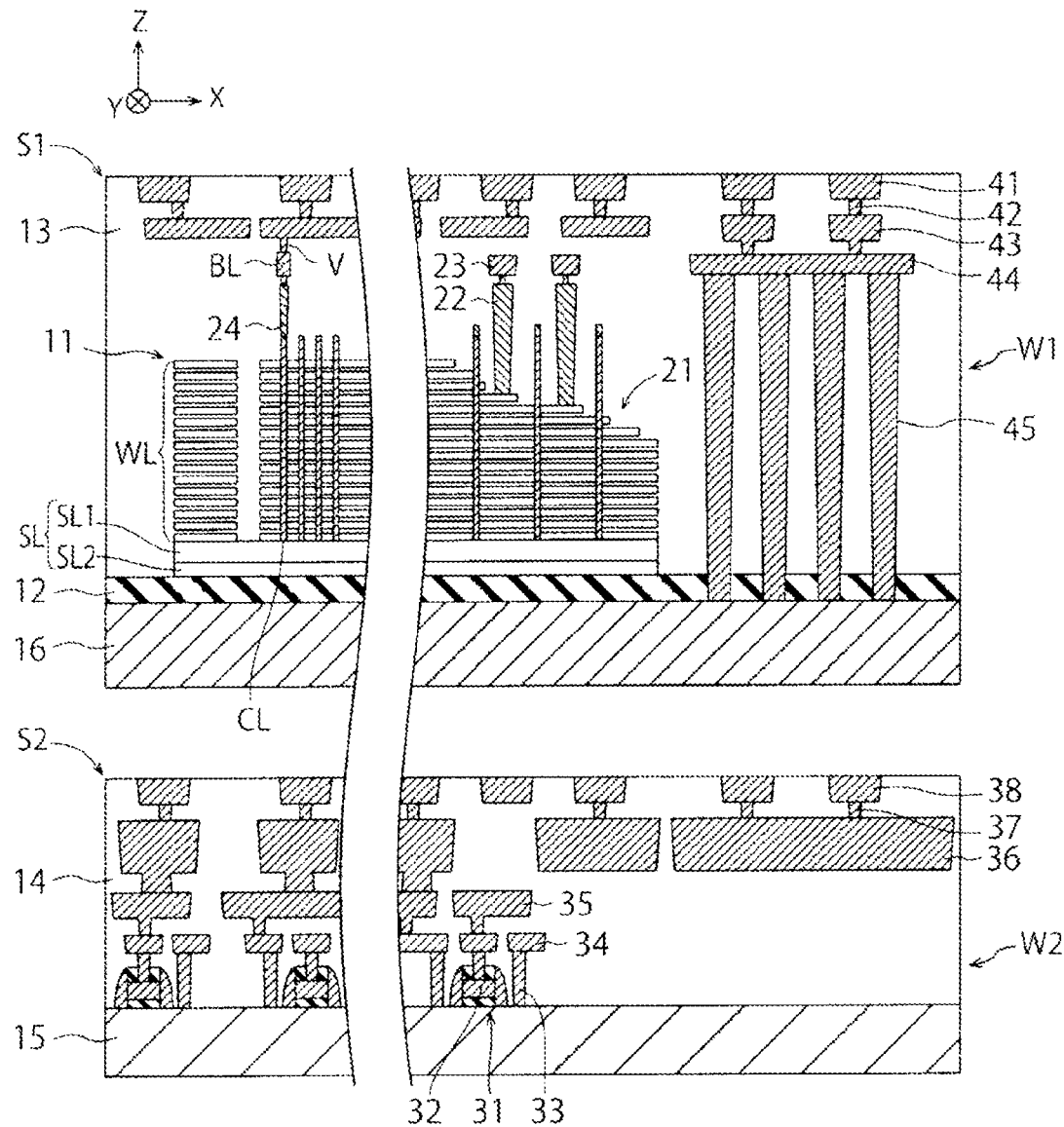
FIG. 17 illustrates a cross-sectional view of a structure for explaining aspects of a manufacturing method of the semiconductor device according to the third embodiment.

FIG. 17 illustrates a cross-sectional view of a structure to show a manufacturing method of the semiconductor device according to the third embodiment. FIG. 17 shows an array wafer W1 including a plurality of array chips C1, and a circuit wafer W2 including a plurality of circuit chips C2. The array wafer W1 is also referred to as a memory wafer, and the circuit wafer W2 is also referred to as a CMOS wafer.

It should be noted that the orientation of the memory wafer W1 of FIG. 17 is opposite to the orientation of the array chip C1 of FIG. 15. In the present embodiment, the array wafer W1 and the circuit wafer W2 are bonded together to manufacture the semiconductor device. FIG. 17 shows the memory wafer W1 before the orientation is reversed for bonding, and FIG. 15 shows the array chip C1 after the orientation is reversed for bonding and is bonded and diced.

In FIG. 17, a reference numeral S1 shows an upper surface of the memory wafer W1, and a reference numeral S2 shows an upper surface of the circuit wafer W2. It should be noted that the memory wafer W1 includes a substrate 16 provided under the insulating film 12. The substrate 16 is, for example, a semiconductor substrate such as a silicon substrate. The substrate 15 is an example of a first substrate, and the substrate 16 is an example of a second substrate.

In the present embodiment, first, as shown in FIG. 17, the memory cell array 11, the insulating film 12, the interlayer insulating film 13, the staircase structure portion 21, the metal pads 41, and the like are formed on the substrate 16 of the memory wafer W1, and the interlayer insulating film 14, the transistors 31, the metal pads 38, and the like are formed on the substrate 15 of the circuit wafer W2. For example, the via plugs 45, the wiring layers 44, the wiring layers 43, the via plugs 42, and the metal pads 41 are sequentially formed on the substrate 16. In addition, the contact plugs 33, the wiring layers 34, the wiring layers 35, the wiring layers 36, the via plugs 37, and the metal pads 38 are sequentially formed on the substrate 15. Next, the array wafer W1 and the circuit wafer W2 are bonded together by mechanical pressure. As a result, the interlayer insulating film 13 and the interlayer insulating film 14 are bonded.

Next, the array wafer W1 and the circuit wafer W2 are annealed at 400° C. As a result, the metal pads 41 and the metal pads 38 are joined together.

Thereafter, the array wafer W1 and the circuit wafer W2 are cut into a plurality of chips after the substrate 15 is thinned by Chemical Mechanical Polishing (CMP) and the substrate 16 is removed by CMP. In this way, the semiconductor device of FIG. 15 is manufactured. The metal pad 46 and the passivation film 47 are formed on the insulating film 12, for example, after the substrate 15 is thinned and the substrate 16 is removed.

While the array wafer W1 and the circuit wafer W2 are bonded together in the present embodiment, array wafers W1 may be bonded together instead. The contents described above with reference to FIGS. 15 to 17, and the contents described below with reference to FIGS. 18 and 19 are also applicable to bonding of the array wafers W1 to each other.

While FIG. 15 shows a boundary surface between the interlayer insulating film 13 and the interlayer insulating film 14, and a boundary surface between the metal pad 41 and the metal pad 38, it is common that these boundary surfaces are not observed after the above annealing. However, positions of these boundary surfaces may be estimated by detecting, for example, an inclination of a side surface of the metal pads 41 or a side surface of the metal pads 38, or a positional deviation between the side surface of the metal pads 41 and the metal pads 38.

In addition, the structures of the semiconductor device according to the first embodiment and the structures of the semiconductor device according to the second embodiment may be applied to the array chip C1 according to the third embodiment. An example of such structures will be described below with reference to FIGS. 18 and 19.

Figure 18A:
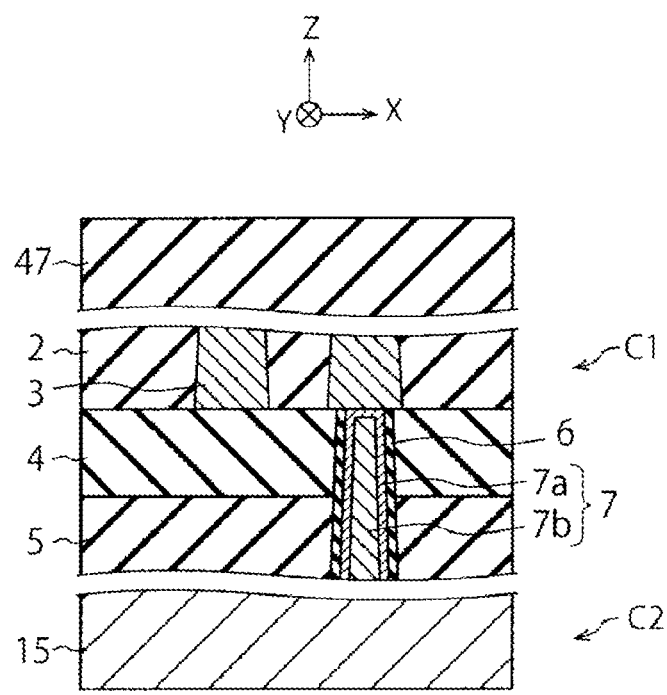
FIGS. 18A and 18B illustrate cross-sectional views of a first example of the structures of the semiconductor device according to the third embodiment.
Figure 18B:
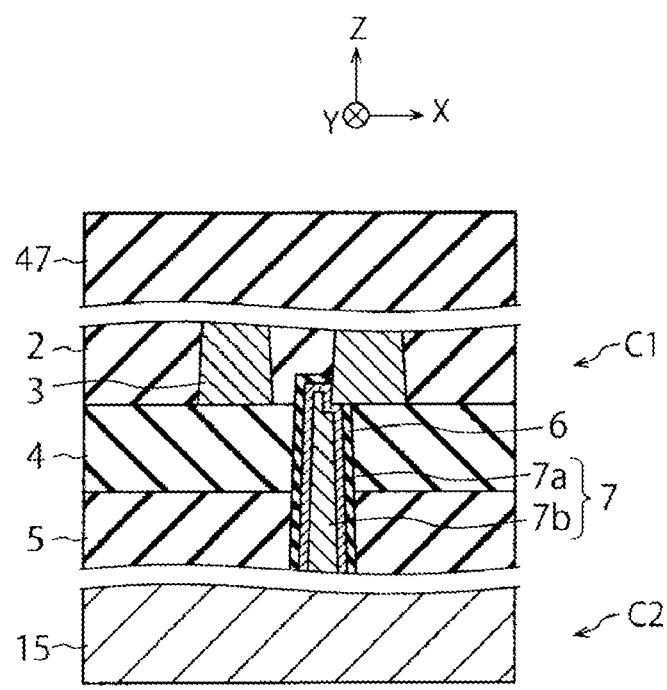

FIGS. 18A and 18B illustrate cross-sectional views of a first example of structures of the semiconductor device according to the third embodiment.

The semiconductor device in this example is implemented by applying the structures of the semiconductor device according to the first embodiment to the array chip C1 of the third embodiment. FIG. 18A shows the semiconductor device in a case where the via plug 7 has been formed without a positional deviation with respect to the wiring 3, and FIG. 18B shows the semiconductor device in a case where the via plug 7 has been formed with a positional deviation with respect to the wiring 3. It should be noted that, the orientation of the array chip C1 in FIGS. 18A and 18B is opposite to the orientation of the semiconductor device in FIGS. 1A and 1B since the semiconductor device according to the present embodiment is manufactured after bonding the array wafer W1 and the circuit wafer W2.

The structure of the semiconductor device according to the present embodiment will be described below with reference to FIG. 18A, but this description is also applicable to FIG. 18B.

When manufacturing the semiconductor device according to the present embodiment, first, the steps of FIGS. 2A to 7B are performed to produce the array wafer W1 having the structure shown in FIG. 1A. At this time, the first interlayer insulating film 2, the plurality of wirings 3, the second interlayer insulating film 4, the third interlayer insulating film 5, the insulating film 6, and the via plug 7 are formed on the substrate 16 instead of the substrate 1. Next, as described with reference to FIG. 17, the array wafer W1 and the circuit wafer W2 are bonded together, followed by dicing and the like. In this way, the semiconductor device of FIG. 18A is manufactured.

The wiring 3 and the via plug 7 in this example are, for example, the bit line BL and the via plug V shown in FIG. 15. It should be noted that, while the via plug 7 is formed on the wiring 3 in FIG. 1A, the via plug 7 (the via plug V) is formed under the wiring 3 (the bit line BL) in FIGS. 15 and 18A.

Figure 19A:
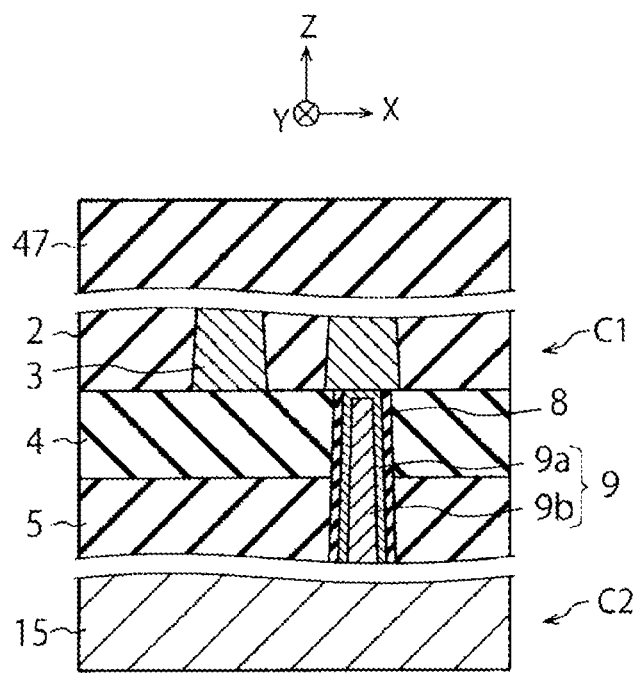
Figure 19B:
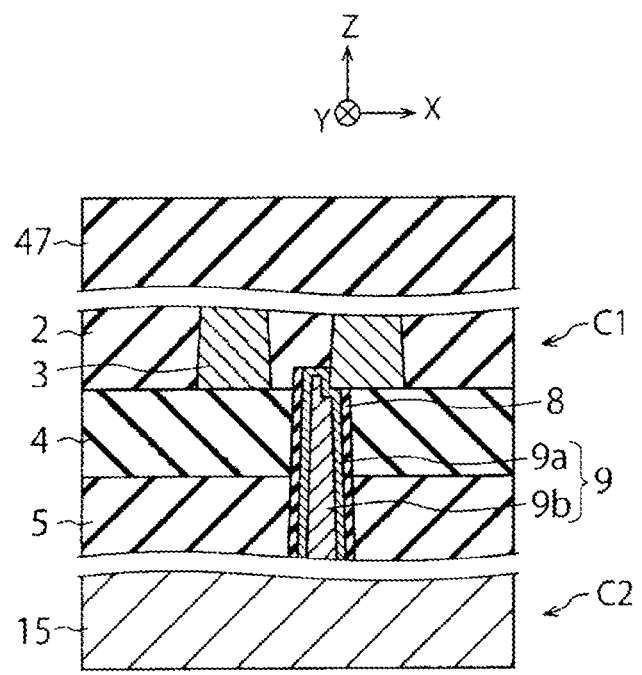

FIGS. 19A and 19B illustrate cross-sectional views of a second example of the structures of the semiconductor device according to the third embodiment.

The semiconductor device in this example is implemented by applying the structures of the semiconductor device according to the second embodiment to the array chip C1 according to the third embodiment. FIG. 19A shows the semiconductor device in a case where the via plug 9 has been formed without a positional deviation with respect to a wiring 3, and FIG. 19B shows the semiconductor device in a case where the via plug 9 has been formed with a positional deviation with respect to the wiring 3. It should be noted that, the orientation of the array chip C1 in FIGS. 19A and 19B is opposite to the orientation of the semiconductor device in FIGS. 8A and 8B since the semiconductor device according to the present embodiment is manufactured after bonding the array wafer W1 and the circuit wafer W2.

The structure of the semiconductor device according to the present embodiment will be described below with reference to FIG. 19A, while this description is also applicable to FIG. 19B.

When manufacturing the semiconductor device according to the present embodiment, first, the steps of FIGS. 9A to 14B are performed to produce the array wafer W1 having the structure shown in FIG. 8A. At this time, the first interlayer insulating film 2, the plurality of wirings 3, the second interlayer insulating film 4, the third interlayer insulating film 5, the insulating film 8, and the via plug 9 are formed on the substrate 16 instead of the substrate 1. Next, as described with reference to FIG. 17, the array wafer W1 and the circuit wafer W2 are bonded together, followed by dicing and the like. In this way, the semiconductor device of FIG. 19A is manufactured.

The wiring 3 and the via plug 9 in this example are, for example, the bit line BL and the via plug V shown in FIG. 15. It should be noted that, while the via plug 9 is formed on the wiring 3 in FIG. 8A, the via plug 9 (the via plug V) is formed under the wiring 3 (the bit line BL) in FIGS. 15 and 19A.

As described above, the semiconductor device according to the present embodiment includes the insulating film 6 containing aluminum and oxygen and the via plug 7 containing W, and includes the insulating film 8 containing silicon and oxygen and the via plug 9 containing tungsten under the wiring 3 containing Cu. According to the present embodiment, the reaction between the wiring 3 and the via plug 7 and 9 is less likely to occur.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device, comprising:
 a substrate;

a transistor provided on the substrate;

a plurality of bit lines provided above the transistor, each of the plurality of bit lines containing copper and extending in a first direction, the plurality of bit lines being arranged in a second direction crossing the first direction;

a memory cell array provided above the plurality of bit lines;

a first insulating film between the memory cell array and the plurality of bit lines;

a plug extending through the first insulating film in a third direction crossing the first and second directions, a sharper end of the plug contacting a first bit line of the plurality of bit lines, the plug containing tungsten; and a second insulating film provided between the first insulating film and the plug.

2. The semiconductor device according to claim 1, wherein the second insulating film contains aluminum and oxygen.

3. The semiconductor device according to claim 1, wherein the second insulating film contains silicon and oxygen.

4. The semiconductor device according to claim 1, wherein the second insulating film is in direct contact with the first bit line.

5. The semiconductor device according to claim 1, wherein the second insulating film is in direct contact with the outer surface of the plug.

6. The semiconductor device according to claim 1, wherein the second insulating film is in direct contact with the plug.

7. The semiconductor device according to claim 1, wherein the plug includes:

a first layer containing tungsten that is in direct contact with the second insulating film, and a second layer that is in direct contact with the first layer.

8. The semiconductor device according to claim 7, wherein the first layer is in direct contact with the first bit line.

9. The semiconductor device according to claim 1, wherein at least a part of the plug extends into a layer including the plurality of bit lines.

10. A semiconductor device, comprising:

a first chip including:

a first substrate; and a transistor on the first substrate; and a second chip that is bonded to the first chip, and including:

a memory cell array;

a plurality of bit lines provided below the memory cell array, each of the plurality of bit lines containing copper and extending in a first direction, the plurality of bit lines being arranged in a second direction crossing the first direction;

a first insulating film provided between the memory cell array and the plurality of bit lines;

a plug extending through the first insulating film in a third direction crossing the first and second directions, a sharper end of the plug contacting a first bit line of the plurality of bit lines, the plug containing tungsten; and a second insulating film provided between the first insulating film and the plug, and a bonding metal provided on a bonding surface of the first chip and the second chip and electrically connecting the first bit line to the transistor.

11. The semiconductor device according to claim 10, wherein the second insulating film contains aluminum and oxygen.

12. The semiconductor device according to claim 10, wherein the second insulating film contains silicon and oxygen.

13. The semiconductor device according to claim 10, wherein at least a part of the plug extends into a layer including the plurality of bit lines.

* * * * *